(12) United States Patent
Yakunin et al.

(10) Patent No.: US 9,448,492 B2
(45) Date of Patent: Sep. 20, 2016

(54) MULTILAYER MIRROR, METHOD OF PRODUCING A MULTILAYER MIRROR AND LITHOGRAPHIC APPARATUS

(75) Inventors: Andrei Mikhailovich Yakunin, Mierlo (NL); Denis Alexandrovich Glushkov, Alfter (DE); Vladimir Nikolaevich Polkovnikov, Nizhny Novgorod (RU); Nikolay Nikolaevitch Salashchenko, Nizhny Novgorod (RU); Leonid Aizikovitch Sjmaenok, Vaals (NL)

(73) Assignee: ASML NETHERLANDS B.V., Veldhoven (NL)

( * ) Notice: Subject to any disclaimer, the term of this patent is extended or adjusted under 35 U.S.C. 154(b) by 154 days.

(21) Appl. No.: 14/126,326

(22) PCT Filed: Mar. 26, 2012

(86) PCT No.: PCT/EP2012/055326
§ 371 (c)(1),
(2), (4) Date: Mar. 26, 2014

(87) PCT Pub. No.: WO2012/171674
PCT Pub. Date: Dec. 20, 2012

(65) Prior Publication Data
US 2014/0198306 A1    Jul. 17, 2014

Related U.S. Application Data

(60) Provisional application No. 61/497,338, filed on Jun. 15, 2011.

(51) Int. Cl.
G03B 27/54 (2006.01)
G03F 7/20 (2006.01)
(Continued)

(52) U.S. Cl.
CPC .............. *G03F 7/702* (2013.01); *B82Y 10/00* (2013.01); *G02B 5/0816* (2013.01);
(Continued)

(58) Field of Classification Search
CPC .............. G03F 7/70866; G03F 7/702; G03F 7/70883; G02B 5/0816; G02B 5/0875; G02B 5/0891; G21K 1/062; G21K 2201/061; B82Y 10/00
See application file for complete search history.

(56) References Cited

U.S. PATENT DOCUMENTS 6,441,963 B2  8/2002  Murakami et al.
6,449,086 B1  9/2002  Singh
(Continued)

FOREIGN PATENT DOCUMENTS

CN    102089683 A    6/2011
DE    102008040265   1/2010
(Continued)

OTHER PUBLICATIONS

International Search Report and Written Opinion mailed Jun. 12, 2012 in corresponding International Patent Application No. PCT/EP2012/055326.
(Continued)

*Primary Examiner* — Deoram Persaud
(74) *Attorney, Agent, or Firm* — Pillsbury Winthrop Shaw Pittman LLP

(57) ABSTRACT

A multilayer mirror for use in device lithography is configured to reflect and/or pattern radiation having a wavelength in the range of about 6.4 nm to about 7.2 nm. The multilayer mirror has a plurality of alternating layers of materials. The plurality of alternating layers of materials include first layers of materials and second layers of materials. The second layers have a higher refractive index for the radiation than the first layers. The materials of the first layers and the materials of the second layers are mutually chemically unreactive at an interface therebetween at temperatures less than 300° C. This may allow the mirrors to have a narrow boundary region of intermingled materials from alternating layers between the layers, for example of 0.5 nm or less in width, which may improve sharpness of the boundary region and improve reflectivity.

12 Claims, 11 Drawing Sheets

(51) Int. Cl.
*G02B 5/08* (2006.01)
*G21K 1/06* (2006.01)
*B82Y 10/00* (2011.01)

(52) U.S. Cl.
CPC ......... *G02B 5/0875* (2013.01); *G02B 5/0891* (2013.01); *G03F 7/70866* (2013.01); *G03F 7/70883* (2013.01); *G21K 1/062* (2013.01); *G21K 2201/061* (2013.01)

(56) References Cited

U.S. PATENT DOCUMENTS

| | | | |
|---|---|---|---|
| 6,522,716 | B1 | 2/2003 | Murakami et al. |
| 7,336,416 | B2 * | 2/2008 | Van Herpen ........... B82Y 10/00 355/171 |
| 7,920,323 | B2 | 4/2011 | Benoit et al. |
| 7,986,455 | B2 | 7/2011 | Feigl et al. |
| 8,144,830 | B2 * | 3/2012 | Yakshin ................. G21K 1/062 359/360 |
| 8,411,355 | B2 | 4/2013 | Tsarfati et al. |
| 8,638,494 | B2 | 1/2014 | Tsarfati et al. |
| 2001/0033421 | A1 | 10/2001 | Murakami et al. |
| 2004/0022354 | A1 * | 2/2004 | Shimizu ................. B82Y 10/00 378/44 |
| 2005/0199830 | A1 | 9/2005 | Bowering et al. |
| 2006/0270226 | A1 | 11/2006 | Hosoya |
| 2010/0071720 | A1 * | 3/2010 | Ehm ........................ B08B 7/00 134/2 |
| 2010/0271610 | A1 * | 10/2010 | Soer ....................... B82Y 10/00 355/67 |
| 2011/0080573 | A1 * | 4/2011 | Glushkov .............. B82Y 10/00 355/71 |
| 2011/0194087 | A1 * | 8/2011 | Tsarfati ................. B82Y 10/00 355/67 |

FOREIGN PATENT DOCUMENTS

| | | |
|---|---|---|
| JP | 63-88502 | 4/1988 |
| JP | 2001-51106 | 2/2001 |
| JP | 2001-110709 | 4/2001 |
| JP | 2006-332153 | 12/2006 |
| JP | 2007-528608 | 10/2007 |
| JP | 2008-526002 | 7/2008 |
| JP | 2009-526387 | 7/2009 |
| JP | 2010-258447 | 11/2010 |
| WO | 2009/147014 | 12/2009 |
| WO | 2010/003487 | 1/2010 |
| WO | 2010/091907 | 8/2010 |

OTHER PUBLICATIONS

Nilsen, J. et al, "Mo:Y multilayer mirror technology utilized to image the near-field output of a Ni-like Sn laser at 11.9 nm," Optics Letters Opt. Soc. America USA, vol. 28, No. 22, Nov. 15, 2003, pp. 2249-2253(8-12).
Japanese Office Action mailed Dec. 18, 2015 in corresponding Japanese Patent Application No. 2014-515104 (11 pages).
Taiwan Office Action mailed May 18, 2016 in corresponding Taiwan Patent Application No. 101112501 (12 pages).

* cited by examiner

MULTILAYER MIRROR, METHOD OF PRODUCING A MULTILAYER MIRROR AND LITHOGRAPHIC APPARATUS

CROSS-REFERENCE TO RELATED APPLICATIONS

This application is the U.S. national phase entry of International Patent Application No. PCT/EP2012/055326, filed Mar. 26, 2012, which claims the benefit of U.S. provisional application 61/497,338, which was filed on 15 Jun. 2011, and which is incorporated herein in its entirety by reference.

FIELD

The present invention relates to a multilayer mirror and a lithographic apparatus that includes such a multilayer mirror.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A lithographic apparatus typically includes an illumination system configured to condition a radiation beam; a support structure constructed to hold a patterning device, such as a reticle or mask, the patterning device being capable of imparting the radiation beam with a pattern in its cross-section to form a patterned radiation beam; a substrate table constructed to hold a substrate; and a projection system configured to project the patterned radiation beam onto a target portion of the substrate.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$, or by decreasing the value of $k_1$.

In order to shorten the exposure wavelength and, thus, reduce the minimum printable size, it has been proposed to use an extreme ultraviolet (EUV) radiation source. EUV radiation sources are configured to output a radiation wavelength of about and/or below 13.5 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings.

Preferably, both the illumination system and the projection system include a plurality of optical elements in order to focus the radiation on the desired locations on the patterning device and the substrate, respectively. Unfortunately, apart from some gases at low density, no materials are known to be transmissive to EUV radiation.

Therefore, the lithographic apparatus using EUV radiation does not employ transmissive lenses in its illumination system and in its projection system. Instead, the illumination system and the projection system preferably include mirrors. In addition, the patterning device is preferably a reflective device, e.g. a mirror having a reflective surface provided with a pattern formed by an absorptive material on the reflective surface, for the same reason.

In order to further reduce the minimum printable dimensions for device features, it is desirable to employ EUV radiation having even lower wavelength of about 6.9 nm, for example 6.4 to 7.2 nm.

To reflect EUV radiation having such a wavelength of about 6.9 nm, for example 6.4 to 7.2 nm, multilayer mirrors have been proposed having alternating layers of a metal, such as (amongst other examples) La, U or Th, and B or a B compound, such as $B_4C$ or $B_9C$. Such a multilayer mirror reflects the EUV radiation according to Bragg's Law. Good optical performance of the multilayer mirror requires a sharp interface (i.e. transition) between the alternating layers. However, boundary regions between the alternating layers may arise, where the materials of alternating layers are intermingled, for example from interlayer diffusion of the materials of the alternating layers, which may reduce this sharpness and thus may adversely affect the optical performance (e.g. reflectivity) of the resultant multilayer mirror.

Such intermingled boundary regions may arise from chemical interaction between materials forming the different, alternating layers. For example, at an interface between B on La, high chemical reactivity may be present between B and La, leading towards the formation of $LaB_6$, and a reduction in sharpness of the interface between the B and La layers. This process also occurs when B is substituted by $B_4C$. In another example, at an La on B (or $B_4C$) interface, high kinetic energy of relatively heavy La atoms arriving at the surface of relatively light B (or $B_4C$) layer atoms (e.g. during the formation of multilayer architecture when preparing such a multilayer mirror) may result in implantation of the B ($B_4C$) layer with La up to a depth of around 2 nm. Such implantation can result in a reduction in sharpness of the interface between the La and B layers because of the resulting intermingled boundary layer.

SUMMARY

It is desirable to provide, for example, a multilayer mirror which obviates or mitigates at least one challenge experienced in the prior art, whether identified herein or elsewhere, or which provides an alternative to an existing multilayer mirror. Hence, it is one aspect of the invention, amongst others, to provide a multilayer mirror suitable for reflecting radiation having a wavelength from about 6.4 nm to about 7.2 nm, wherein the reflectivity of the multilayer mirror is improved compared to prior art mirrors.

A first aspect of the invention provides a multilayer mirror constructed and arranged to reflect radiation having a wavelength from about 6.4 nm to about 7.2 nm, the multilayer mirror comprising a plurality of alternating layers of materials, the alternating layers of materials comprising first layers of materials and second layers of materials, wherein the second layers have a higher refractive index for said radiation than the first layers, and wherein the first layers and second layers are of materials effective to be mutually chemically unreactive at an interface therebetween at temperatures less than 300° C.

At the interface between a first layer and a second layer, there will typically be a boundary region where material from the first layer and material from the second layer are mixed to form a boundary region where there is a transition in composition from the material of the first layer to the material of the second layer. In prior art multilayer mirrors, this boundary region may have a width of for example about 1 nm or more. Such boundary layers arise from interpenetration of the materials during the formation of the mirror, when high temperatures may be experienced locally, or may arise from subsequent interdiffusion of the materials. For the multilayer mirrors of the first aspect of the invention, the width of the boundary region between first and second layers may be 0.5 nm or less, preferably 0.3 nm or less, even more preferably 0.2 nm or less, even as low as 0.1 nm or less.

Hence, the first aspect of the invention may also be said to provide a multilayer mirror constructed and arranged to reflect radiation having a wavelength from about 6.4 nm to about 7.2 nm, the multilayer mirror comprising a plurality of alternating layers of materials, the alternating layers of materials comprising first layers of materials and second layers of materials, wherein the second layers have a higher refractive index for said radiation than the first layers, wherein the width of each boundary region in which the first and second layers are mutually intermingled, is 0.5 nm or less.

The width of the boundary region may be measured by a suitable means such as energy dispersive analysis of x-rays (EDAX) using a scanning electron microscope to measure the boundary region at a cross-section through a multilayer mirror. In this specification, the boundary region width is defined as the width of the region extending from where the boundary region is 95% molar concentration of the material of the first layer to 95% molar concentration of the material of the second layer.

A second aspect of the invention provides a patterning device constructed and arranged to provide a beam of radiation having a wavelength in the range of about 6.4 nm to about 7.2 nm with a pattern in its cross-section, the patterning device comprising the multilayer mirror of the first aspect of the invention.

A third aspect of the invention provides a lithographic projection apparatus arranged to project a pattern from a patterning device onto a substrate, wherein the lithographic apparatus comprises a multilayer mirror according to the first aspect of the invention and/or a patterning device according to the second aspect of the invention.

A fourth aspect of the invention provides a method of forming a multilayer mirror that is to reflect radiation having a wavelength from about 6.4 nm to about 7.2 nm, the method comprising: providing a plurality of alternating layers of materials, the alternating layers of materials comprising alternating first and second layers of materials; wherein the materials of the first layers are selected from the group consisting of: barium, barium compound, cerium, cerium compound, diamond-like carbon and boron nitride, and wherein the materials of the second layers are selected from the group consisting of B, $B_4C$, $B_9C$, $CaB_6$ and $BaB_6$.

A fifth aspect of the invention provides a method of forming a multilayer mirror that is to reflect radiation having a wavelength from about 6.4 nm to about 7.2 nm, the method comprising providing a plurality of alternating layers of materials, the alternating layers of materials comprising alternating first and second layers of materials; wherein the first layers are of a material selected from the group consisting of uranium and compounds thereof, thallium and compounds thereof, lanthanum and compounds thereof, barium and compounds thereof, cerium and compounds thereof compound, diamond-like carbon and boron nitride, and wherein the second layers are of a material selected from the group consisting of $CaB_6$ and $BaB_6$.

The first aspect of the invention provides a multilayer mirror constructed and arranged to reflect radiation having a wavelength from about 6.4 nm to about 7.2 nm. The multilayer mirror comprises a plurality of alternating layers of materials, the alternating layers of materials comprising first layers of materials and second layers of materials, wherein the second layers have a higher refractive index for said radiation than the first layers. The first layers and second layers are of materials effective to be mutually chemically unreactive at an interface therebetween at temperatures less than 300° C. As already explained, the first aspect of the invention may also be said to provide a multilayer mirror wherein the width of each boundary region between alternating layers, in which the first and second layers are mutually intermingled, is 0.5 nm or less.

A sum of a thickness of the first layer and a thickness of the second layer may be from about 2.2 nm to about 3.5 nm (i.e. the thickness of one first layer and one second layer, combined). The alternating (first and second) layers may have a period thickness (i.e. a sum of thicknesses for a pair of layers) which is between about 1.7 and about 2.5 times the thickness of the first layer or the second layer. In other words, the thickness of the first layer may be from about 40 to 60% of the sum of thicknesses of the first and second layers and the thickness of the second layer may be from about 60 to 40% of the sum of thicknesses of the first and second layers. Typically, a multilayer mirror may comprise from about 30 to about 200 pairs of layers.

The first layer may comprise more than a single material in its construction. For instance, the first layers may comprise an interfacial portion at an interface between the first layers and the second layers.

The interfacial portion of the first layer or the entire first layer may be of a material selected from barium, barium compound, cerium, cerium compound, diamond-like carbon and boron nitride, and the second layers may be of a material selected from the group consisting of B, $B_4C$, $B_9C$, $CaB_6$ and $BaB_6$. Preferably, the interfacial portion of the first layer or the entire first layer may be of diamond-like carbon.

The first layers may comprise a first portion of a material selected from the group consisting of uranium and compounds thereof, thallium and compounds thereof, lanthanum and compounds thereof, with the interfacial portion located between the first portion of the first layers and the second layers. In other words, the first layers may themselves comprise 2 or more layers, such as a first portion and an interfacial portion making up each first layer.

The interfacial portion of the first layer may be present at only one of the interfaces between a first layer and an adjacent second layer, or the interfacial portion may be present at each interface between a first layer and a second layer.

In one suitable arrangement according to the first aspect of the invention, the interfacial portion forms the entire first layers whereby the first layers are of a material selected from barium, barium compound, cerium, cerium compound, diamond-like carbon and boron nitride, preferably of diamond-like carbon. In other words, in this arrangement, the first layers are each of a single material (i.e. a single element or a single compound) as set out herein.

In another arrangement according to the first aspect of the invention, the second layers may be of a material selected from the group consisting of $CaB_6$ and $BaB_6$, with the first layers of a material selected from the group consisting of uranium and compounds thereof, thallium and compounds thereof, lanthanum and compounds thereof, barium and compounds thereof, cerium and compounds thereof compound, diamond-like carbon and boron nitride. Preferably, for this arrangement, the first layers are of barium or a barium compound other than $BaB_6$.

Suitable compounds, should a compound be used for the material of the first layer, include compounds such as fluorides, nitrides, carbides, oxides, hydrides, iodides or the like.

When first layer includes a uranium compound, the uranium compound may be selected from the group consisting of $UF_3$, $UF_4$, $UF_5$, $UCl_3$, $UCl_4$, $UCl_5$, $UI_3$, $UI_4$, $UO$, $UO_2$, $UO_3$, $U_3O_8$, $U_2O_5$, $U_3O_7$, $U_4O_9$, $UTe_2$, $UTe_3$, $UN$, $U_2N_3$, and $U_3N_2$. When the first layer includes a thorium compound, the thorium compound may be selected from the group consisting of $ThF_3$, $ThF_4$, $ThCl_4$, $ThI_2$, $ThI_3$, $ThI_4$, $ThH_2$, $ThO_2$, $ThSe_2$, and $ThN$. When the first layer includes a lanthanum compound, the lanthanum compound may be selected from the group consisting of $LaH_2$, $LaH_3$, $LaF_3$, $LaCl_3$, $LaI_3$, $La_2O_3$, $LaSe$, and $LaTe$. When the first layer includes a barium compound, the barium compound may be selected from the group consisting of $BaF_2$, $Ba_3N_2$, $BaC_2$, $BaO$, $BaH_2$ and $BaI_2$.

When the first layer includes a cerium compound, the cerium compound may be selected from the group consisting of $Ce$, $CeC_2$, $CeN$, $CeI_2$, $CeF_2$, $CeH_2$. In an embodiment, the cerium compound may be selected from $CeC_2$ and $CeN$.

The mirror may form part of a projection system configured to project a patterned radiation beam onto a target portion of a substrate. Alternatively or additionally, the mirror may be form part of an illumination system configured to condition a radiation beam.

The second aspect of the invention provides a patterning device constructed and arranged to provide a beam of radiation having a wavelength from about 6.4 nm to about 7.2 nm. The patterning device is arranged to provide a pattern in the cross-section of the beam of radiation. The patterning device comprises the multilayer mirror of the first aspect of the invention. The patterning device may be a reticle or a mask. The multilayer mirror of the first aspect of the invention may form at least a part of the patterning device constructed and arranged to provide a beam of the radiation with a pattern in its cross-section. The reticle or mask may be provided with a structure having an absorptive material arranged to define a pattern, the absorptive material being Cr, Ta, Ti, Si, Ru, Mo, Al, or any combination thereof. The multilayer mirror may have a substantially reflective surface provided with a capping layer comprising Ru, Rh, Ta, Ti, or any combination thereof.

The third aspect of the invention provides a lithographic projection apparatus arranged to project a pattern from a patterning device onto a substrate, wherein the lithographic apparatus comprises a multilayer mirror according to the first aspect of the invention and/or a patterning device according to the second aspect of the invention.

The lithographic apparatus of the third aspect of the invention may further comprise: an illumination system configured to condition a radiation beam having a wavelength from about 6.4 nm to about 7.2 nm; a support structure constructed to hold a patterning device, the patterning device adapted for imparting the radiation beam with a pattern in its cross-section to form a patterned radiation beam; a substrate table constructed to hold a substrate; and a projection system configured to project the patterned radiation beam onto a target portion of the substrate. The multilayer mirror according to the first aspect of the invention may form a part of any one or more of: the illumination system, the patterning device and the projection system.

The fourth aspect of the invention provides a method of forming a multilayer mirror that is to reflect radiation having a wavelength from about 6.4 nm to about 7.2 nm, the method comprising: providing a plurality of alternating layers of materials, the alternating layers of materials comprising alternating first and second layers of materials; wherein the material of the first layers are selected from the group consisting of: barium, barium compound, cerium, cerium compound, diamond-like carbon and boron nitride, and wherein the material of the second layers are selected from the group consisting of B, $B_4C$, $B_9C$, $CaB_6$ and $BaB_6$. In an embodiment, the materials of the second layers are selected from $BaF_2$ and $BaI_2$.

The fifth aspect of the invention provides a method of forming a multilayer mirror that is to reflect radiation having a wavelength from about 6.4 nm to about 7.2 nm, the method comprising providing alternating layers, the alternating layers comprising alternating first and second layers; wherein the first layers are of a material selected from the group consisting of uranium and compounds thereof, thallium and compounds thereof, lanthanum and compounds thereof, barium and compounds thereof, cerium and compounds thereof compound, diamond-like carbon and boron nitride, and wherein the second layers are of a material selected from the group consisting of $CaB_6$ and $BaB_6$.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Throughout this specification, the term "comprising" or "comprises" means including the component(s) specified but not to the exclusion of the presence of others. The term "consisting essentially of" or "consists essentially of" means including the components specified but excluding other components except for materials present as impurities, unavoidable materials present as a result of processes used to provide the components, and components added for a purpose other than achieving the technical effect of the invention. Typically, a composition consisting essentially of a set of components will comprise less than 10% by weight, typically less than 5% by weight, more typically less than 3% by weight, such as less than 1% by weight of non-specified components.

Whenever appropriate, the use of the term "comprises" or "comprising" may also be taken to include the meaning or "consisting essentially of" or "consisting of".

The optional and/or preferred features set out in this specification, either in the description or in the claims, may be used either individually or in combination with each other where appropriate and particularly in the combinations as set out in the accompanying claims. The optional and/or preferred features for each aspect of the invention set out herein are also applicable to any other aspects of the invention, where appropriate.

Figure 1:
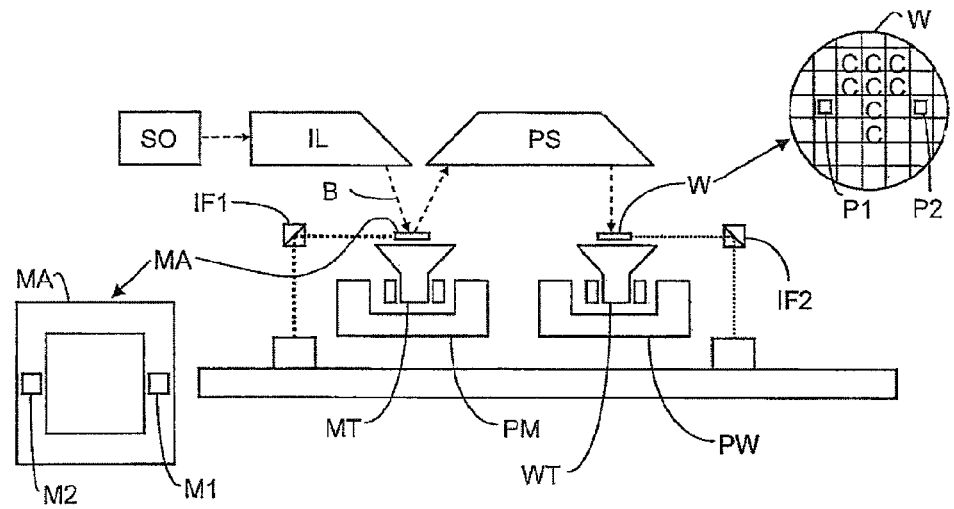
FIG. 1 schematically depicts a lithographic apparatus according to an embodiment of the present invention.

FIG. 1 schematically depicts a lithographic apparatus according to an embodiment of the invention. The apparatus includes: an illumination system (illuminator) IL configured to condition a radiation beam B (e.g. EUV radiation); a patterning device support or support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation. However, optical components which are configured to condition the radiation beam B are preferably reflective components due to the wavelength of radiation constituting the beam B.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as desired. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive, but is preferably reflective when used to pattern a beam of EUV radiation. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" may encompass any type of projection system, including refractive, reflective, catadioptric, magnetic, electromagnetic and electrostatic optical systems, or any combination thereof, as appropriate for the exposure radiation being used, or for other factors, especially the use of a vacuum. It may be desired to use a vacuum for EUV radiation and/or electron beam radiation since other gases may absorb too much radiation or electrons. A vacuum environment may therefore be provided to the whole beam path with the aid of a vacuum wall and vacuum pumps.

As here depicted, the apparatus is of a reflective type (e.g. employing a reflective mask). Alternatively, the apparatus may be of a transmissive type (e.g. employing a transmissive mask), although this is likely to be impractical in an EUV lithographic apparatus, particularly when using a radiation of wavelength from about 6.4 to 7.2 nm.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if desired, may be referred to as a radiation system.

The illuminator IL may include an adjuster to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
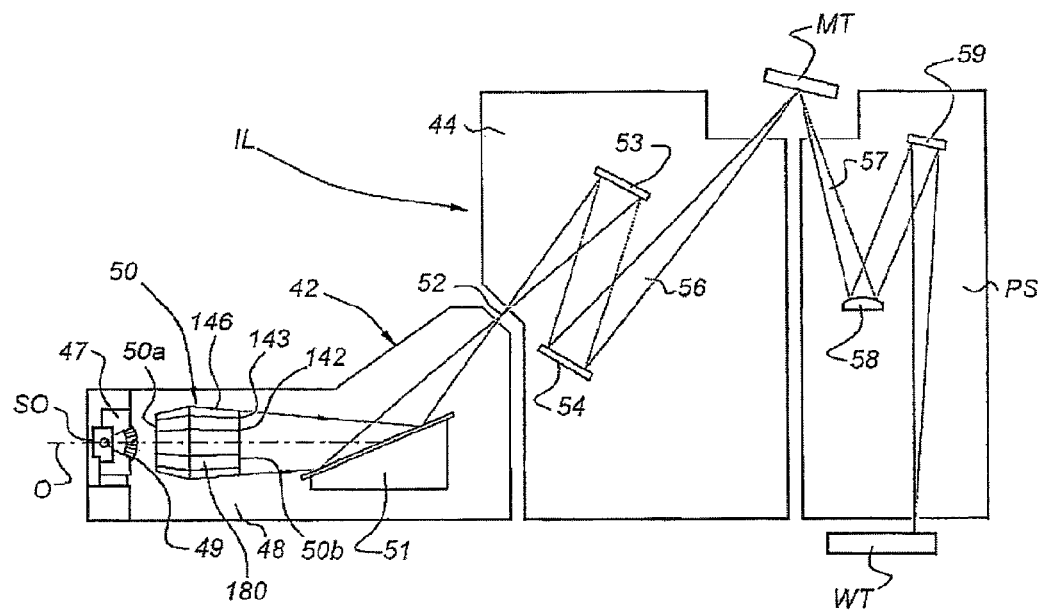
FIG. 2 schematically depicts a side view of an EUV illumination system and projection system of the lithographic projection apparatus of FIG. 1.

FIG. 2 shows the lithographic apparatus of FIG. 1 in more detail, including a radiation system 42, an illumination optics unit 44, and the projection system PS. The radiation system 42 includes the radiation source SO which may be formed by a discharge plasma (a DPP source). EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, an electrical discharge. Partial pressures of, for example, 10 Pa of Xe, Li, Sn vapor or any other suitable gas or vapor may be desired for efficient generation of the radiation. The radiation emitted by radiation source SO is passed from a source chamber 47 into a collector chamber 48 via a gas barrier or contaminant trap 49 which is positioned in or behind an opening in source chamber 47. The gas barrier 49 may include a channel structure.

The collector chamber 48 includes a radiation collector 50 which may be formed by a grazing incidence collector. Radiation collector 50 has an upstream radiation collector side 50a and a downstream radiation collector side 50b. Radiation passed by collector 50 can be reflected off a grating spectral filter 51 to be focused in a virtual source point 52 at an aperture in the collector chamber 48. From collector chamber 48, a beam of radiation 56 is reflected in illumination optics unit 44 via normal incidence reflectors 53, 54 onto a reticle or mask positioned on reticle or mask table MT. A patterned beam 57 is formed which is imaged in projection system PS via reflective elements 58, 59 onto wafer stage or substrate table WT. More elements than shown may generally be present in illumination optics unit 44 and projection system PS. Grating spectral filter 51 may optionally be present, depending upon the type of lithographic apparatus. Further, there may be more mirrors present than those shown in the Figures, for example there may be 1-4 more reflective elements present than 58, 59. Radiation collectors 50 are known from the prior art. The collector 50 may be a nested collector with reflectors 142, 143, and 146. A space 180 is provided between two reflectors, e.g. between reflectors 142 and 143.

In another embodiment (not shown), the source may be a laser produced plasma radiation source (an LPP source).

As discussed above, in order to reflect EUV radiation having a wavelength of about 6.4 nm to 7.2 nm, multilayer mirrors have been proposed having alternating layers of a material that is absorbent with respect to that radiation, and a material that is substantially optically transparent to that radiation. More particularly, to reflect EUV radiation having a wavelength of about 6.4 to 7.2 nm, multilayer mirrors have been proposed, in the prior art, that are formed from alternating layers of a metal, such as (amongst other examples) La, U or Th, and B or a B compound, such as $B_4C$ or $B_9C$.

Figure 3:
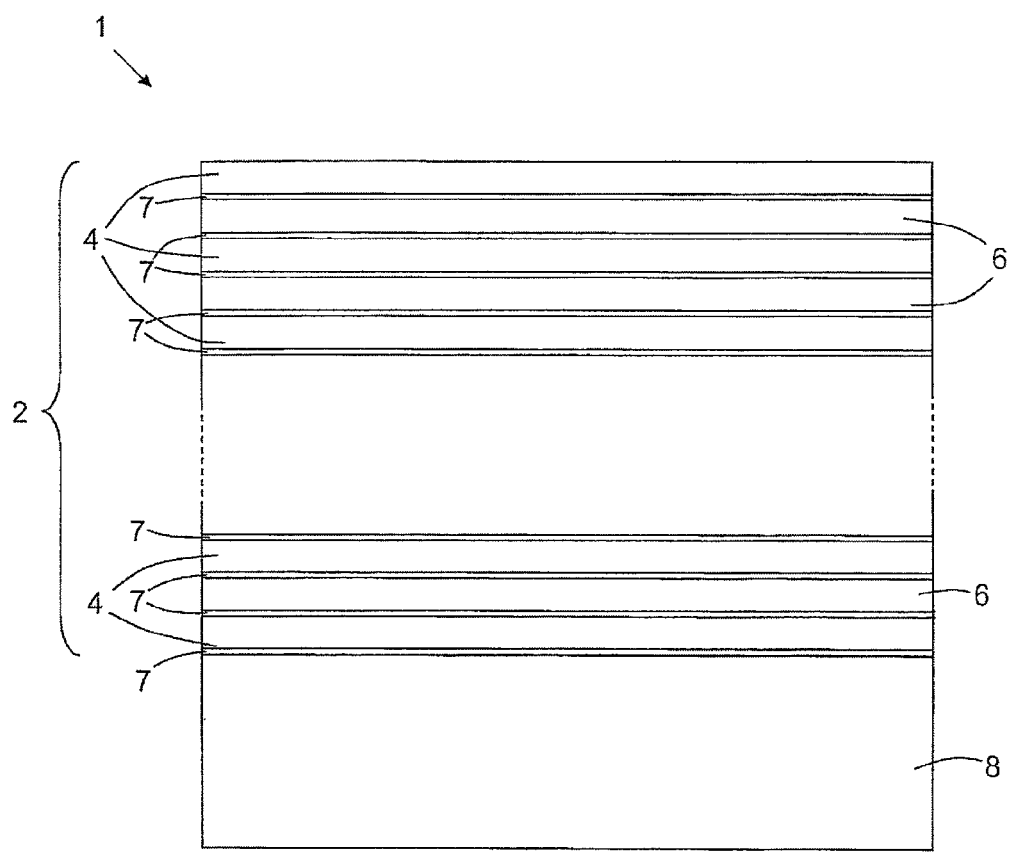
FIG. 3 schematically depicts a multilayer mirror of the lithographic apparatus of FIG. 1, according to an embodiment of the present invention.

FIG. 3 depicts an embodiment of a multilayer mirror 1 according to the invention. The multilayer mirror 1 is constructed and arranged to reflect radiation having a wavelength from about 6.4 nm-about 7.2 nm. The multilayer mirror includes a layered structure 2 which has alternating layers 4, 6 supported by a substrate 8. In embodiments of the invention, the multilayer mirror may be located in various parts of the lithographic apparatus, such as the projection system and the illumination system, or form a part of the patterning device of that lithographic apparatus.

In an embodiment, as set out hereinbefore, alternating layers 4, 6 may be, for the first layers: uranium and compounds thereof, thallium and compounds thereof, lanthanum and compounds thereof, barium and compounds thereof, cerium and compounds thereof compound, diamond-like carbon and boron nitride. In this arrangement, the second layers may be selected from the group consisting of $CaB_6$ and $BaB_6$.

In an embodiment, as set out hereinbefore, the first layers may be selected from the group consisting of: barium, barium compound, cerium, cerium compound, diamond-like carbon and boron nitride, and the second layers selected from the group consisting of B, $B_4C$, $B_9C$, $CaB_6$ and $BaB_6$.

The first layers and second layers are of materials effective to be mutually chemically unreactive at an interface therebetween at temperatures less than 300° C. At the interface between a first layer and a second layer, there will typically be a boundary region where material from the first layer and material from the second layer are mixed to form a boundary region where there is a transitioning composition from the material of the first layer to the material of the second layer. In prior art multilayer mirrors, this boundary region may have a width of about 1 nm. Such boundary layers arise from interpenetration of the materials during the formation of the mirror, when high temperatures may be experienced locally, or may arise from subsequent interdiffusion of the materials. Without wishing to be bound by theory, it is thought that providing materials for the first and second layers which are mutually chemically unreactive at temperatures less than 300° C. enables the width of this boundary region to be reduced providing a sharper contrast between the refractive index of the first layer and the refractive index of the second layer for the radiation of interest, such as radiation having a wavelength from about 6.4 to 7.2 nm.

It can be seen in FIG. 3 that between a first layer 4, and a second layer 6, an optional interlayer 7 is provided configured to further reduce diffusion between the first layer 4 and the second layer 6. A suitable interlayer may comprise, for instance, Mo, Cr, Sn or Cs in solid form (i.e. as the material itself or as a compound thereof). Cs is preferred as in solid form, used as an interlayer, this material may be advantageous. One potential advantage is that Cs is one of the most transparent materials with respect to EUV radiation. However, the interlayer 7, if present, may contribute to the width of the boundary region between alternating first and second layers 4, 6. Hence, it is preferable if such an optional interlayer 7, if present, is of a very low thickness (such as 0.2 nm or less, such as a monolayer) or more preferably is completely absent.

The alternating layers 4, 6 of multilayer mirrors 1 of FIG. 3 can be suitably manufactured by way of deposition techniques such as magnetron sputtering or electron beam sputtering.

The multilayer structure 2 of the multilayer mirror 1 may be supported by a substrate 8 in order to reduce mechanical vulnerability. Also, it is to be noted that the dotted lines in FIG. 3 indicates an unspecified number of repeating alternating first and second layers 4, 6. Typically, the multilayer structure 2 of the mirror 1 is formed by a number of 30 to 200 periods of alternating layers, i.e. a total number of layers between 60 and 400. Moreover, it should be noted that the Figures are schematic serving merely as illustrations and that they are not scale drawings.

$BaF_2$ and $BaI_2$ are particularly suitable materials for the first layer as they are commonly available in the form of magnetron targets suitable for sputter deposition of thin layers.

$CeC_2$ and CeN are suitable materials for the first layer when a cerium compound is to be used in the first layer because these compounds provide a slightly higher reflectivity and wider reflectance bandwidth (i.e. reflect at high reflectivity over a wider range of wavelengths) than elemental cerium.

When B is present in the second layer in the form of hexaboride, such as $CaB_6$ and $BaB_6$ it is less chemically active at the interface towards materials of the first layer, such as La, than when present as simply B. This lack of reactivity assist in providing a sharp contrast of refractive index at the interface in the multilayer mirror structure.

Furthermore, the hexaboride compounds have a high density, which may result in higher contrast between the first and second layers of the multilayer structure. However, the presence of the cation Ba or Ca will lead to a minor reduction in reflectivity, because of an absorption effects arising from the presence of the metal cation. However, the overall reflectivity of the system is enhanced.

Diamond like carbon (DLC) has certain properties which make it attractive for use as a material in the first layers. Specifically, DLC (predominantly $sp^3$ bonded) has a density which is higher than that of amorphous carbon or graphite (predominantly $sp^2$ bonded). This provides a highly refractive index contrast with second layer materials such as boron and so can yield a high theoretical reflectance of about 80% in the desired wavelength range. Furthermore, in the DLC form of carbon, the carbon atoms are strongly bound to each other, typically by $sp^3$ bonding, and this reduces chemical reactivity between the carbon in the first layers and any material used in the second layers, such as boron.

If boron nitride (BN) is used as a material for the first layer, with boron as the material for the second layer, the multilayer mirror may be manufactured in a relatively simple manner by deposition of boron alternating with periodic nitrification of the boron as the deposition progresses.

When the first layers are of barium or a compound thereof and the second layers are of a compound selected from the group consisting of B, $B_4C$, $B_9C$, $CaB_6$ and $BaB_6$, it is preferred that the barium compound of the first layers is a compound other than $BaB_6$. This is in order to ensure good contrast in refractive index between the first layers and the second layers.

For some combinations of first and second layers according to the invention, the bandwidth over which high reflectivity is exhibited may be narrower than before prior art multilayer mirrors. Such mirrors may be more suitable for use as, for instance, source collector or first mirror after the intermediate focus as these optical devices typically only experience a narrow range of incident angles across the width of the optical device, so that a narrow bandwidth multilayer mirror does not necessarily result in any substantial reduction in reflectivity for the radiation having a wavelength from about 6.4 nm to about 7.2 nm.

FIGS. 4 to 21 are all graphs showing the theoretical expected reflectance R as a function of wavelength λ for alternating layers of various combinations of materials which are suitable for use in the multilayer mirrors of the invention (assuming no intermingling at interfaces between layers).

The combinations of materials set out in the examples shown in FIGS. 4 to 21 are particularly preferred combinations of materials for the first and second layers for use in multilayer mirrors constructed and arranged to reflect radiation having a wavelength from about 6.4 nm to about 7.2 nm. The use of these combinations of materials is disclosed as part of the invention, irrespective of the other technical details set out in the examples such as layer thickness, numbers of pairs of layers and the like.

Figure 4:
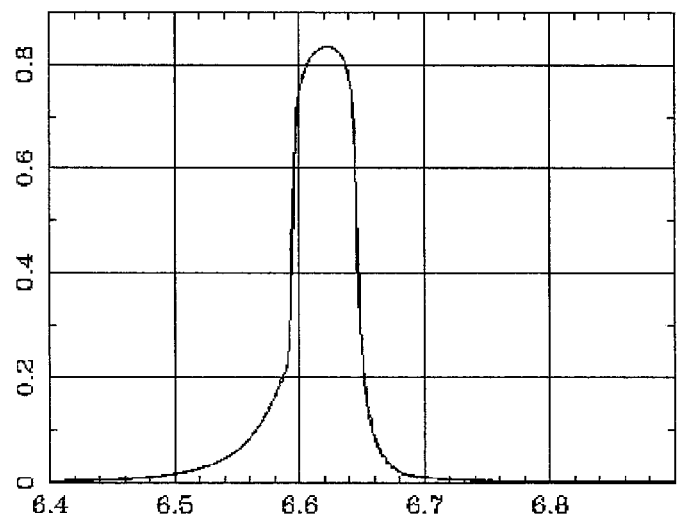
FIGS. 4 to 21 each schematically depict a reflectance of embodiments of the multilayer mirror of FIG. 3, as a function of wavelength.

For each of these figures, the angle of incidence is 90°, the different layers are of equal thickness (each having a thickness which is 50% of the of the sum thickness) and the number of pairs of first and second layers is 1000, FIG. 4 shows theoretical reflectivity for a Ba/B multilayer mirror with sum thickness=3.31 nm.

Figure 5:
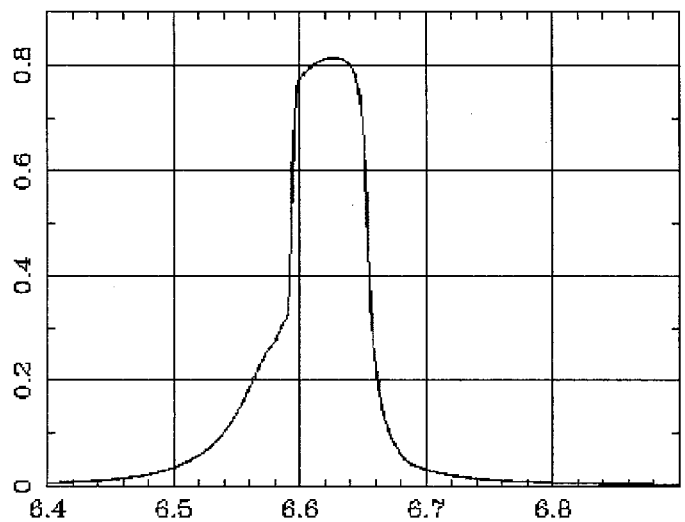

FIG. 5 shows theoretical reflectivity for a La/B multilayer mirror (comparative example) with sum thickness=3.32 nm.

Figure 6:
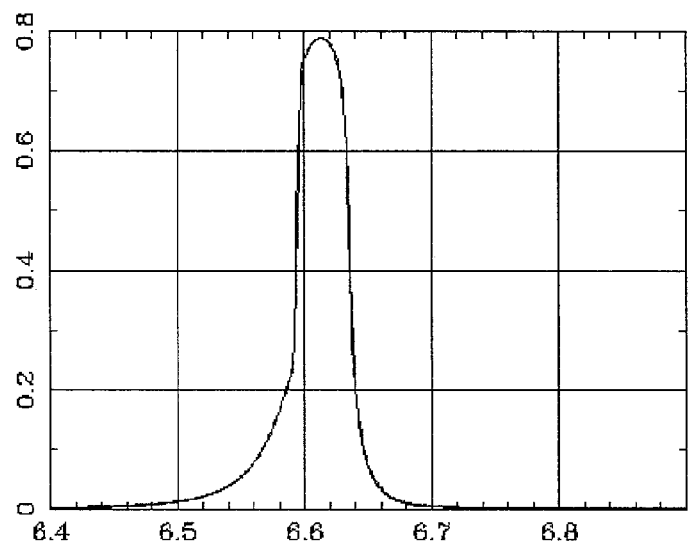

FIG. 6 shows theoretical reflectivity for a Ba/$B_4C$ multilayer mirror with sum thickness=3.31 nm.

Figure 7:
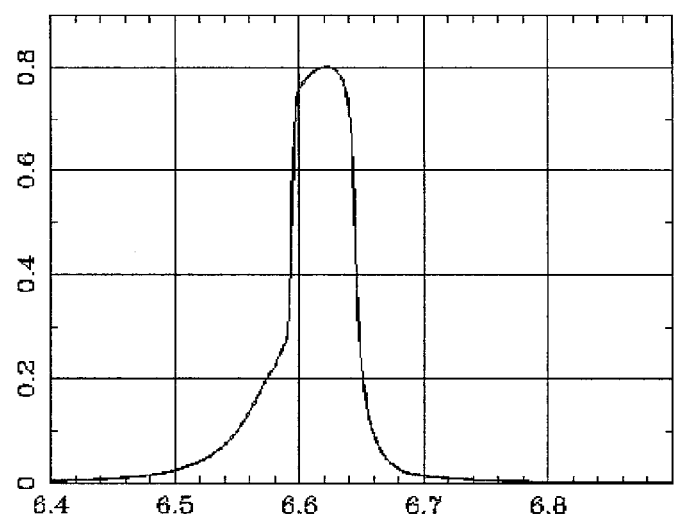

FIG. 7 shows theoretical reflectivity for a $BaI_2$/B multilayer mirror with sum thickness=3.31 nm.

Figure 8:
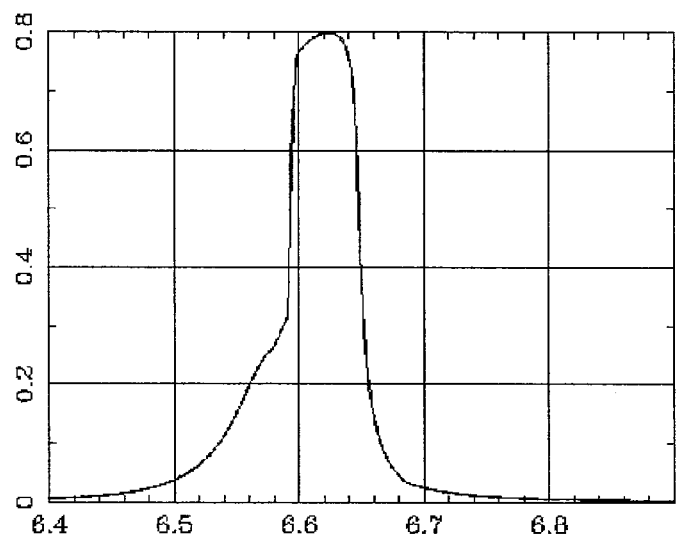

FIG. 8 shows theoretical reflectivity for a BaO/B multilayer mirror with sum thickness=3.315 nm.

Figure 9:
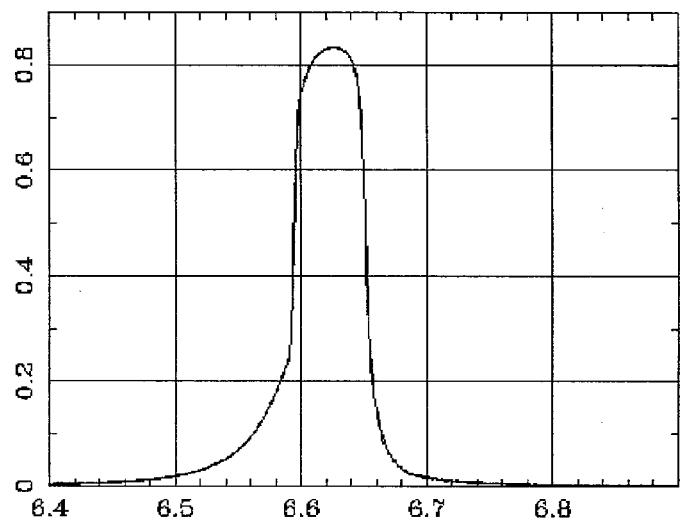

FIG. 9 shows theoretical reflectivity for a $BaH_2$/B multilayer mirror with sum thickness=3.315 nm.

Figure 10:
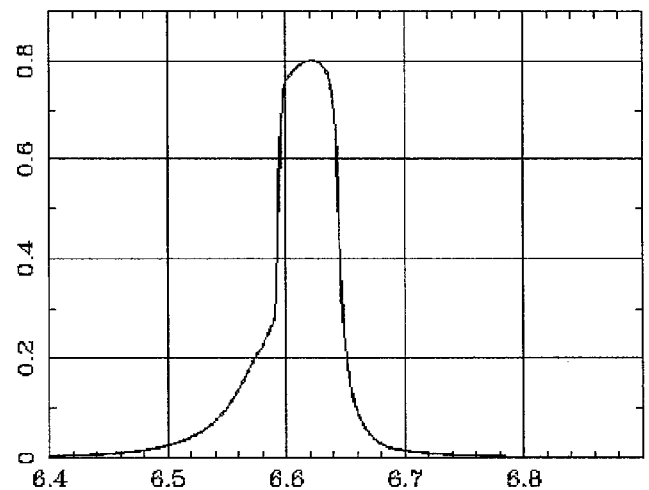

FIG. 10 shows theoretical reflectivity for a $Ba_3N_2$/B multilayer mirror with sum thickness=3.315 nm.

Figure 11:
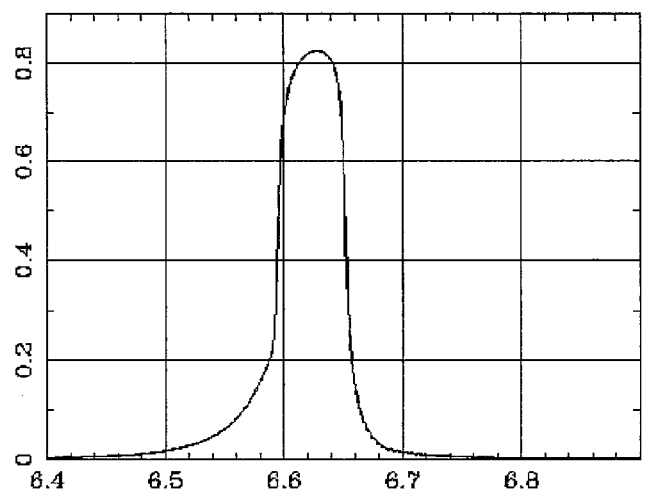

FIG. 11 shows theoretical reflectivity for a $BaC_2$/B multilayer mirror with sum thickness=3.315 nm.

Figure 12:
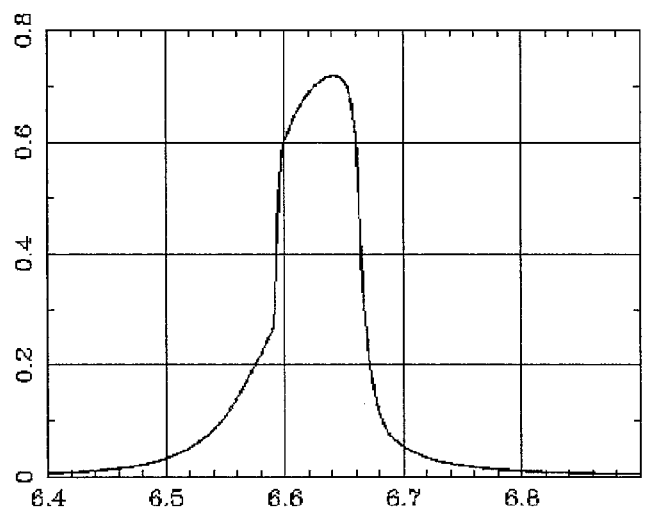

FIG. 12 shows theoretical reflectivity for a Ce/B multilayer mirror with sum thickness=3.33 nm.

Figure 13:
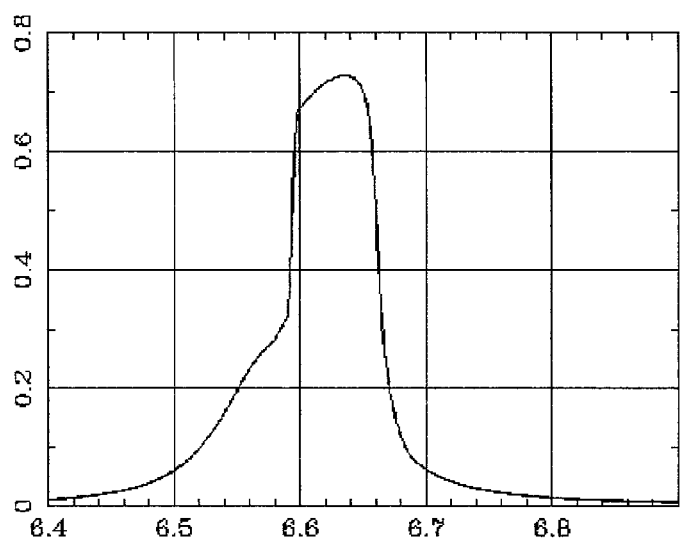

FIG. 13 shows theoretical reflectivity for a CeN/B multilayer mirror with sum thickness=3.33 nm.

Figure 14:
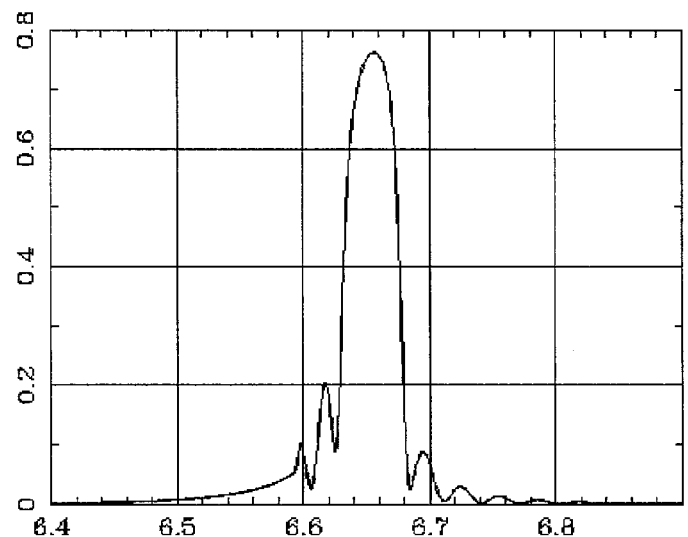

FIG. 14 shows theoretical reflectivity for a C/B multilayer mirror with sum thickness=3.33 nm (Density=2.2 g/cm³ bulk carbon).

Figure 15:
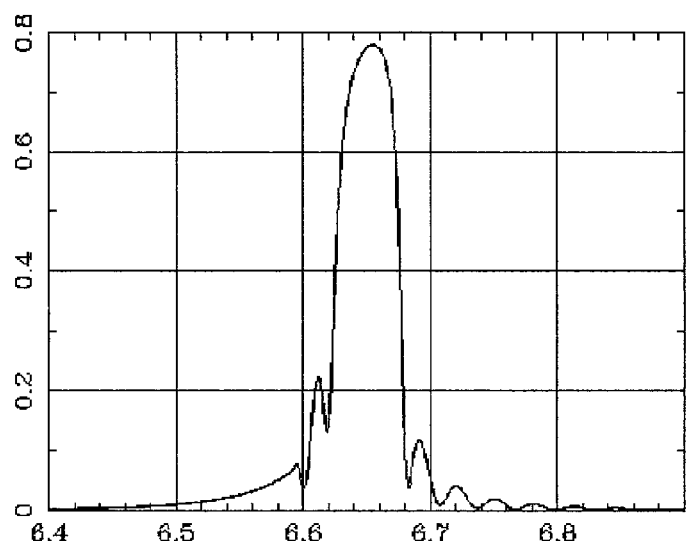

FIG. 15 shows theoretical reflectivity for a C/B multilayer mirror with sum thickness=3.33 nm (Density=2.7 g/cm³ bulk carbon).

Figure 16:
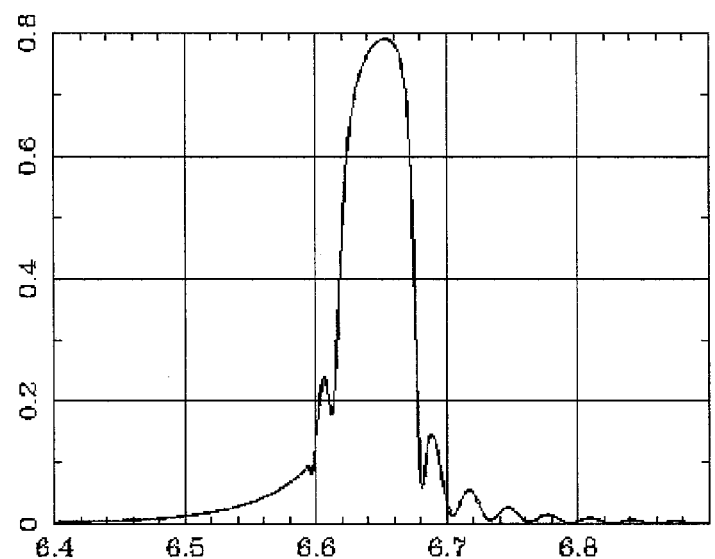

FIG. 16 shows theoretical reflectivity for a C/B multilayer mirror with sum thickness=3.33 nm (Density=3.2 g/cm³ bulk carbon).

Figure 17:
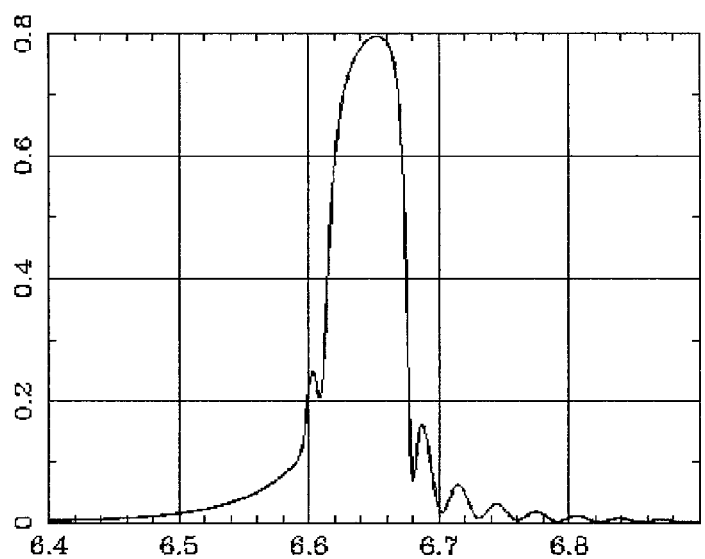

FIG. 17 shows theoretical reflectivity for a C/B multilayer mirror with sum thickness=3.33 nm (Density=3.5 g/cm³ bulk carbon).

Figure 18:
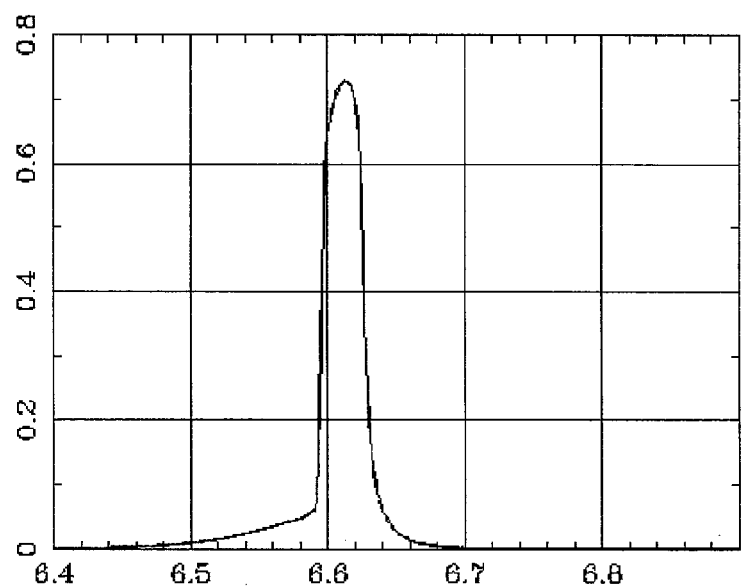

FIG. 18 shows theoretical reflectivity for a BN/B multilayer mirror with sum thickness=3.29 nm.

Figure 19:
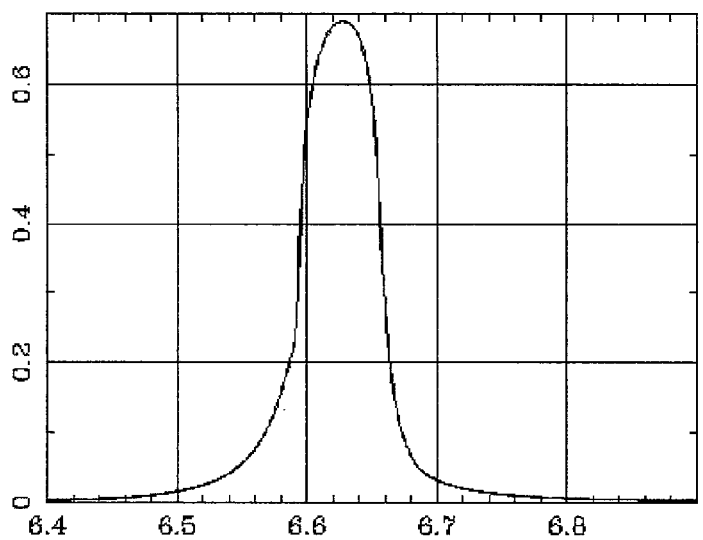

FIG. 19 shows theoretical reflectivity for a La/CaB$_6$ multilayer mirror with sum thickness=3.335 nm.

Figure 20:
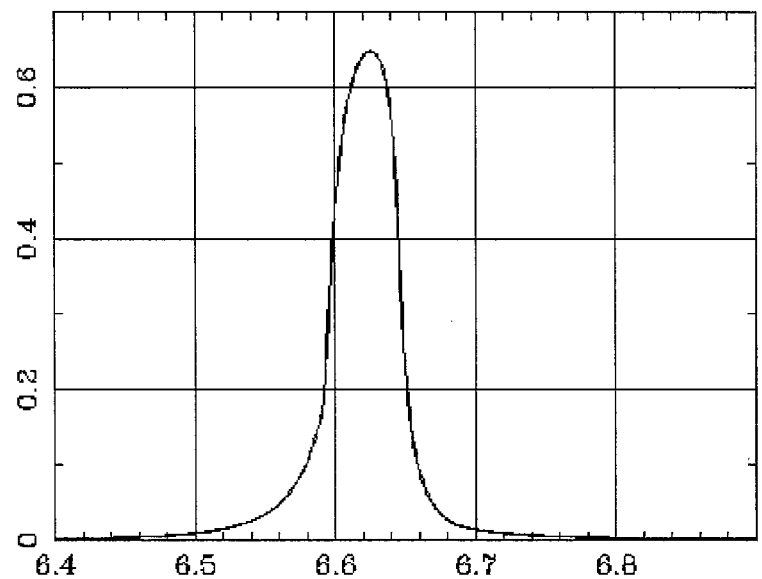

FIG. 20 shows theoretical reflectivity for a La/BaB$_6$ multilayer mirror with sum thickness=3.34 nm.

Figure 21:
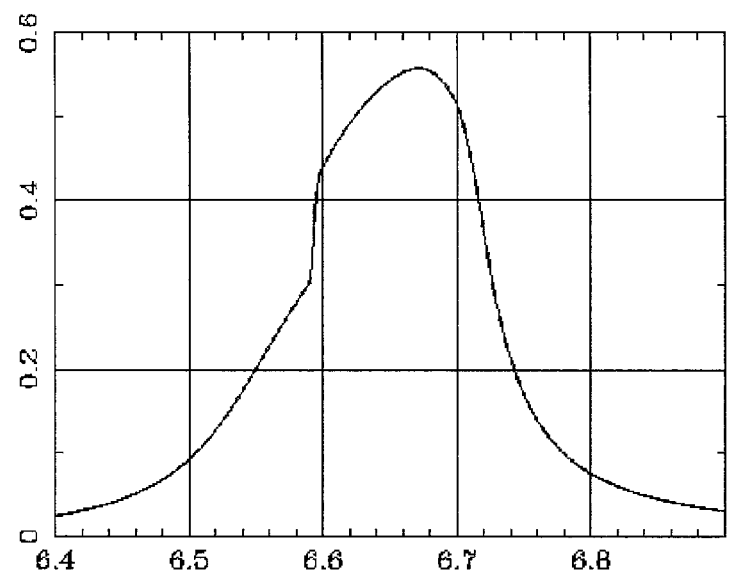

FIG. 21 shows theoretical reflectivity for a U/CaB$_6$ multilayer mirror with sum thickness=3.39 nm.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography.

While specific embodiments of the invention have been described above, it will be appreciated that the invention may be practiced otherwise than as described. For example, the multilayer mirror may be used in any application in which reflection of radiation having a wavelength in the range of about 6.4 nm to about 7.2 nm is desirable or required (e.g. in a radiation source, an alignment system, or the like).

The described and illustrated embodiments are to be considered as illustrative and not restrictive in character, it being understood that only the preferred embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

The descriptions above are intended to be illustrative, not limiting. Thus, it will be apparent to one skilled in the art that modifications may be made to the invention as described without departing from the scope of the claims set out below.

What is claimed is:

1. A multilayer mirror constructed and arranged to reflect radiation having a wavelength from about 6.4 nm to about 7.2 nm, the multilayer mirror comprising:

a plurality of alternating layers of materials, comprising first layers of materials and second layers of materials, wherein the second layers have a higher refractive index for said radiation than the first layers, and wherein the materials of the first layers and the materials of the second layers are mutually chemically unreactive at an interface therebetween at temperatures less than 300° C., wherein each of the second layers is of a material selected from the group consisting of CaB$_6$ and BaB$_6$, and wherein each of the first layers is of a material selected from the group consisting of uranium and compounds thereof, thallium and compounds thereof, lanthanum and compounds thereof, barium and compounds thereof, cerium and compounds thereof compound, diamond-like carbon and boron nitride.

2. The multilayer mirror of claim 1, wherein each of the first layers comprises an interfacial portion at an interface between the first layer and an adjacent second layer, wherein the interfacial portion of the first layer is of a material selected from barium, barium compound, cerium, cerium compound, diamond-like carbon and boron nitride, and wherein the adjacent second layer is of a material selected from the group consisting of B, B$_4$C, B$_9$C, CaB$_6$ and BaB$_6$.

3. The multilayer mirror of claim 2, wherein the interfacial portion is of diamond-like carbon.

4. The multilayer mirror of claim 2, wherein each of the first layers comprises a first portion having a material selected from the group consisting of uranium and compounds thereof, thallium and compounds thereof, lanthanum and compounds thereof, and wherein the interfacial portion is located between the first portion of the first layer and the adjacent second layer.

5. The multilayer mirror of claim 4, wherein the interfacial portion is present at each interface between one of the first layers and one of the second layers.

6. The multilayer mirror of claim 2, wherein the interfacial portion forms the entire first layer, and wherein each of the first layers is of a material selected from barium, barium compound, cerium, cerium compound, diamond-like carbon and boron nitride.

7. The multilayer mirror of claim 1, wherein each of the first layers is of barium or a compound thereof other than BaB$_6$.

8. A patterning device constructed and arranged to provide a beam of radiation having a wavelength from about 6.4 nm to about 7.2 nm with a pattern in its cross-section, the patterning device comprising:

a multilayer mirror constructed and arranged to reflect radiation having a wavelength from about 6.4 nm to about 7.2 nm, the multilayer mirror comprising a plurality of alternating layers of materials, comprising first layers of materials and second layers of materials, wherein the second layers have a higher refractive index for said radiation than the first layers, and wherein the materials of the first layers and the materials of the second layers are mutually chemically unreactive at an interface therebetween at temperatures less than 300° C.

wherein each of the second layers is of a material selected from the group consisting of CaB$_6$ and BaB$_6$, and wherein each of the first layers is of a material selected from the group consisting of uranium and compounds thereof, thallium and compounds thereof, lanthanum and compounds thereof, barium and compounds thereof, cerium and compounds thereof compound, diamond-like carbon and boron nitride.

9. A lithographic projection apparatus arranged to project a pattern from a patterning device onto a substrate, wherein the lithographic apparatus comprises a multilayer mirror constructed and arranged to reflect radiation having a wavelength from about 6.4 nm to about 7.2 nm, the multilayer mirror comprising a plurality of alternating layers of materials, comprising first layers of materials and second layers of materials, wherein the second layers have a higher refractive index for said radiation than the first layers, and wherein the materials of the first layers and the materials of the second layers are mutually chemically unreactive at an interface therebetween at temperatures less than 300° C., wherein each of the second layers is of a material selected from the group consisting of $CaB_6$ and $BaB_6$, and wherein each of the first layers is of a material selected from the group consisting of uranium and compounds thereof, thallium and compounds thereof, lanthanum and compounds thereof, barium and compounds thereof, cerium and compounds thereof compound, diamond-like carbon and boron nitride.

10. The lithographic apparatus of claim 9, further comprising:
    an illumination system configured to condition a radiation beam having a wavelength from about 6.4 nm to about 7.2 nm;
    a support structure constructed to hold a patterning device, the patterning device configured to impart the radiation beam with a pattern in its cross-section to form a patterned radiation beam;
    a substrate table constructed to hold a substrate; and
    a projection system configured to project the patterned radiation beam onto a target portion of the substrate.

11. The lithographic apparatus of claim 10, wherein a multilayer mirror forms a part of any one or more of:
    the illumination system;
    the patterning device; and
    the projection system.

12. A method of forming a multilayer mirror that is to reflect radiation having a wavelength from about 6.4 nm to about 7.2 nm, the method comprising:
    providing a plurality of alternating layers of materials, the alternating layers of materials comprising alternating first and second layers of materials, wherein the materials of the first layers are selected from the group consisting of uranium and compounds thereof, thallium and compounds thereof, lanthanum and compounds thereof, barium and compounds thereof, cerium and compounds thereof compound, diamond-like carbon and boron nitride, and wherein the materials of the second layers are selected from the group consisting of $CaB_6$ and $BaB_6$.

* * * * *